(12) United States Patent
Lin

(10) Patent No.: US 6,437,452 B2
(45) Date of Patent: *Aug. 20, 2002

(54) BUMPLESS FLIP CHIP ASSEMBLY WITH STRIPS-IN-VIA AND PLATING

(76) Inventor: Charles Wen Chyang Lin, 55 Cairnhill Road #21-04 Cairnhill Plaza, Singapore (SG), 229666

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/464,561

(22) Filed: Dec. 16, 1999

(51) Int. Cl.$^7$ .......................... H01L 23/48; H01L 23/52; H01L 29/40

(52) U.S. Cl. .................... 257/784; 257/773; 257/778

(58) Field of Search ............................... 257/780, 781, 257/774, 786, 773, 778, 784

(56) References Cited

U.S. PATENT DOCUMENTS

| | | | |
|---|---|---|---|
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,074,947 A | 12/1991 | Estes et al. | 156/307.3 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,196,371 A | 3/1993 | Kulesza et al. | 437/183 |

(List continued on next page.)

FOREIGN PATENT DOCUMENTS

| | | | |
|---|---|---|---|
| EP | 0 718 882 A1 | 6/1996 | H01L/23/057 |
| WO | WO 97/38563 | 10/1997 | H05K/1/03 |
| WO | WO 99/57762 | 11/1999 | H01L/23/48 |

OTHER PUBLICATIONS

Markstein et al., "Controlling the Variables in Stencil Printing," Electronic Packaging & Production, Feb. 1997, pp. 48–56.
Elenius, "Choosing a Flip Chip Bumping Supplier –Technology an IC Package contractor should look for," Advanced Packaging, Mar./Apr. 1998, pp. 70–73.
Erickson, "Wafer Bumping: The Missing Link DCA," Electronic Packaging & Production, Jul. 1998, pp. 43–46.
Kuchenmeister et al., "Film Chip Interconnection Systems Prepared By Wet Chemical Metallization," IEEE publication 0–7803–4526–Jun. 1998, Jun. 1998, 5 pages.
Ghaffarian, "Long Time BGA Assembly Reliability," Advancing Microelectronics, vol. 25, No. 6, Sep./Oct. 1998, pp. 20–23.
U.S. Application Ser. No. 09/120,408, filed Jul. 22, 1998, entitled "Flip Chip Assembly With Via Interconnection".
U.S. Application Ser. No. 09/465,024, filed Dec. 16, 1999, entitled "Bumpless Flip Chip Assembly With Solder Vai".
U.S. Application Ser. No. 09/464,562, filed Dec. 16, 1999, entitled "Bumpless Flip Chip Assembly With Strips And Via–Fill".

Primary Examiner—Sheila V. Clark
(74) Attorney, Agent, or Firm—David M. Sigmond

(57) ABSTRACT

A flip chip assembly, and methods of forming the same, including a single or multi-layer substrate having a plurality of via holes in which pre-formed strips or leads inside the via holes serve as the connections between the semiconductor device and substrate circuitry. The assembling steps include attaching an integrated circuit (IC) chip having a plurality of input/output terminal pads to a rigid or flexible substrate having a plurality of leads extending from the patterned circuitry traces and hanging inside a plurality of through via holes. The via holes are aligned with and expose the terminal pads After attachment, an electrically conductive material connects the leads to the IC terminal pads through electrolytic plating, electroless (chemical) plating or solder re-flow processes. The conductive material provides mechanical support as well as electrical continuity between the IC chip and the circuitry of the substrate.

56 Claims, 9 Drawing Sheets

U.S. PATENT DOCUMENTS

| | | | | |
|---|---|---|---|---|
| 5,209,817 | A | 5/1993 | Ahmad et al. | 156/643 |
| 5,237,130 | A | 8/1993 | Kulesza et al. | 174/260 |
| 5,260,234 | A | 11/1993 | Long | 437/203 |
| 5,261,593 | A | 11/1993 | Casson et al. | 228/180.22 |
| 5,275,330 | A | 1/1994 | Issacs et al. | 228/180.2 |
| 5,284,796 | A | 2/1994 | Nakanishi et al. | 437/183 |
| 5,293,067 | A | 3/1994 | Thompson et al. | 257/668 |
| 5,327,010 | A | 7/1994 | Uenaka et al. | 257/679 |
| 5,334,804 | A | 8/1994 | Love et al. | 174/267 |
| 5,346,750 | A | 9/1994 | Hatakeyama et al. | 428/209 |
| 5,355,283 | A | 10/1994 | Marrs et al. | 361/760 |
| 5,358,621 | A | 10/1994 | Oyama | 205/123 |
| 5,397,921 | A | 3/1995 | Karnezos | 257/779 |
| 5,407,864 | A | 4/1995 | Kim | 437/203 |
| 5,424,245 | A | 6/1995 | Gurtler et al. | 437/183 |
| 5,438,477 | A | 8/1995 | Pasch | 361/689 |
| 5,439,162 | A | 8/1995 | George et al. | 228/180.22 |
| 5,447,886 | A | 9/1995 | Rai | 437/183 |
| 5,454,161 | A | 10/1995 | Beilin et al. | 29/852 |
| 5,454,928 | A | 10/1995 | Rogers et al. | 205/125 |
| 5,475,236 | A | 12/1995 | Yoshizaki | 257/48 |
| 5,477,933 | A | 12/1995 | Nguyen | 174/262 |
| 5,478,007 | A | 12/1995 | Marrs | 228/180.22 |
| 5,483,421 | A | 1/1996 | Gedney et al. | 361/771 |
| 5,484,647 | A | 1/1996 | Nakatani et al. | 428/209 |
| 5,487,218 | A | 1/1996 | Bhatt et al. | 29/852 |
| 5,489,804 | A | 2/1996 | Pasch | 257/778 |
| 5,493,096 | A | 2/1996 | Koh | 219/121.71 |
| 5,508,229 | A | 4/1996 | Baker | 437/183 |
| 5,525,065 | A | 6/1996 | Sobhani | 439/67 |
| 5,536,973 | A | 7/1996 | Yamaji | 257/737 |
| 5,542,601 | A | 8/1996 | Fallon et al. | 228/119 |
| 5,547,740 | A | 8/1996 | Higdon et al. | 428/209 |
| 5,556,810 | A | 9/1996 | Fujitsu | 437/209 |
| 5,556,814 | A | 9/1996 | Inoue et al. | 437/230 |
| 5,564,181 | A | 10/1996 | Dineen et al. | 29/841 |
| 5,572,069 | A | 11/1996 | Schneider | 257/690 |
| 5,576,052 | A | 11/1996 | Arledge et al. | 427/98 |
| 5,583,073 | A | 12/1996 | Lin et al. | 439/183 |
| 5,595,943 | A | 1/1997 | Itabashi et al. | 437/230 |
| 5,599,744 | A | 2/1997 | Koh et al. | 437/195 |
| 5,602,422 | A * | 2/1997 | Schueller et al. | |
| 5,611,140 | A | 3/1997 | Kulesza et al. | 29/832 |
| 5,611,884 | A | 3/1997 | Bearinger et al. | 156/325 |
| 5,613,296 | A | 3/1997 | Kurino et al. | 29/852 |
| 5,614,114 | A | 3/1997 | Owen | 219/121.66 |
| 5,615,477 | A | 4/1997 | Sweitzer | 29/840 |
| 5,619,791 | A | 4/1997 | Lambrecht, Jr. et al. | 29/852 |
| 5,627,405 | A | 5/1997 | Chillara | 257/668 |
| 5,627,406 | A | 5/1997 | Pace | 257/700 |
| 5,633,204 | A | 5/1997 | Tago et al. | 438/614 |
| 5,637,920 | A | 6/1997 | Loo | 257/700 |
| 5,641,113 | A | 6/1997 | Somaki et al. | 228/180.22 |
| 5,645,628 | A | 7/1997 | Endo et al. | 106/1.23 |
| 5,646,067 | A | 7/1997 | Gaul | 437/180 |
| 5,646,442 | A * | 7/1997 | Abe et al. | |
| 5,648,686 | A | 7/1997 | Hirano et al. | 257/778 |
| 5,654,584 | A | 8/1997 | Fujitsu | 257/666 |
| 5,656,858 | A | 8/1997 | Kondo et al. | 257/737 |
| 5,663,598 | A | 9/1997 | Lake et al. | 257/737 |
| 5,665,652 | A | 9/1997 | Shimizu | 438/127 |
| 5,666,008 | A | 9/1997 | Tomita et al. | 257/778 |
| 5,669,545 | A | 9/1997 | Pham et al. | 228/1.1 |
| 5,674,785 | A | 10/1997 | Akram et al. | 437/217 |
| 5,674,787 | A | 10/1997 | Zhao et al. | 437/230 |
| 5,682,061 | A | 10/1997 | Khandros et al. | 257/666 |
| 5,691,041 | A | 11/1997 | Frankeny et al. | 428/209 |
| 5,722,162 | A | 3/1998 | Chou et al. | 29/852 |
| 5,723,369 | A | 3/1998 | Barber | 438/106 |
| 5,731,223 | A | 3/1998 | Padmanabhan | 437/183 |
| 5,736,456 | A | 4/1998 | Akram | 438/614 |
| 5,739,585 | A | 4/1998 | Akram et al. | 257/698 |
| 5,744,859 | A | 4/1998 | Ouchida | 257/668 |
| 5,757,071 | A | 5/1998 | Bhansali | 257/697 |
| 5,757,081 | A | 5/1998 | Chang et al. | 257/778 |
| 5,764,486 | A | 6/1998 | Pendse | 361/774 |
| 5,774,340 | A | 6/1998 | Chang et al. | 361/771 |
| 5,789,271 | A | 8/1998 | Akram | 438/18 |
| 5,798,285 | A | 8/1998 | Bentlage et al. | 438/108 |
| 5,801,072 | A | 9/1998 | Barber | 438/107 |
| 5,801,447 | A | 9/1998 | Hirano et al. | 257/778 |
| 5,803,340 | A | 9/1998 | Yeh et al. | 228/56.3 |
| 5,804,771 | A | 9/1998 | McMahon et al. | 174/255 |
| 5,808,360 | A | 9/1998 | Akram | 257/738 |
| 5,811,879 | A | 9/1998 | Akram | 257/723 |
| 5,817,541 | A | 10/1998 | Averkiou et al. | 438/107 |
| 5,822,856 | A | 10/1998 | Bhatt et al. | 29/832 |
| 5,834,844 | A * | 11/1998 | Akagawa et al. | |
| 5,844,317 | A * | 12/1998 | Bertolet et al. | |
| 5,861,666 | A | 1/1999 | Bellaar | 257/686 |
| 5,863,816 | A | 1/1999 | Cho | 438/123 |
| 5,870,289 | A | 2/1999 | Tokuda et al. | 361/779 |
| 5,883,435 | A | 3/1999 | Geffken et al. | 257/758 |
| 5,925,931 | A | 7/1999 | Yamamoto | 257/737 |
| 5,962,918 | A * | 10/1999 | Kimura | |
| 5,962,921 | A * | 10/1999 | Farnworth et al. | |
| 5,994,222 | A | 11/1999 | Smith et al. | 438/689 |
| 6,011,314 | A * | 1/2000 | Leibovitz | |
| 6,012,224 | A | 1/2000 | DiStefano et al. | 29/840 |
| 6,013,877 | A | 1/2000 | Degani et al. | 174/264 |
| 6,018,196 | A | 1/2000 | Noddin | 257/777 |
| 6,020,561 | A | 2/2000 | Ishida et al. | 174/261 |
| 6,037,665 | A | 3/2000 | Miyazaki | 257/773 |
| 6,046,909 | A | 4/2000 | Joy | 361/748 |
| 6,049,121 | A * | 4/2000 | Toyosawa et al. | |
| 6,084,297 | A | 6/2000 | Brooks et al. | 257/698 |
| 6,084,781 | A | 7/2000 | Klein | 361/771 |
| 6,103,552 | A | 8/2000 | Lin | 438/113 |
| 6,103,992 | A | 8/2000 | Noddin | 219/121.71 |
| 6,114,763 | A * | 9/2000 | Smith | |
| 6,127,204 | A | 10/2000 | Isaacs et al. | 438/106 |
| 6,127,736 | A * | 10/2000 | Akram | |

\* cited by examiner

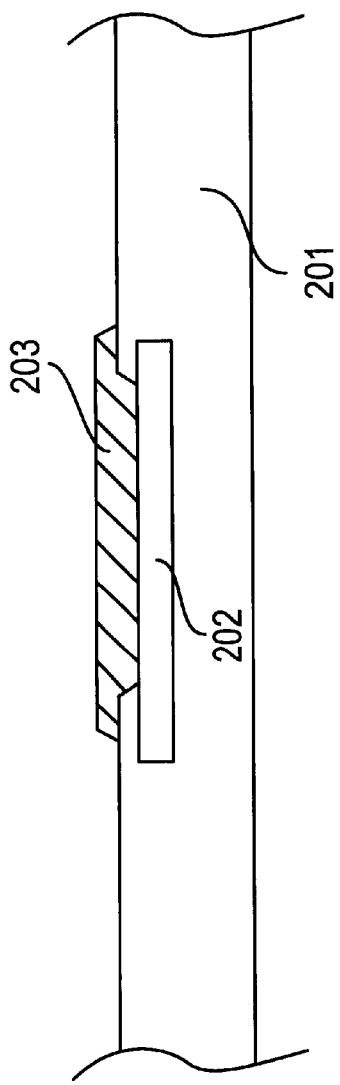
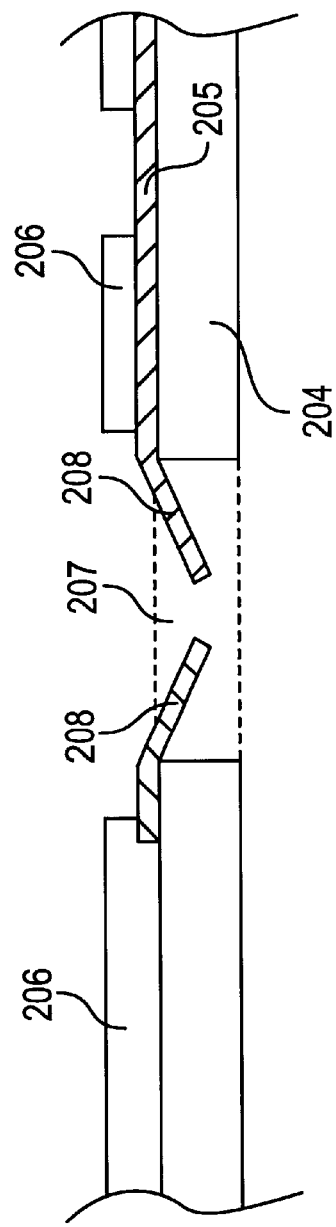
FIG. 2A
FIG. 2B

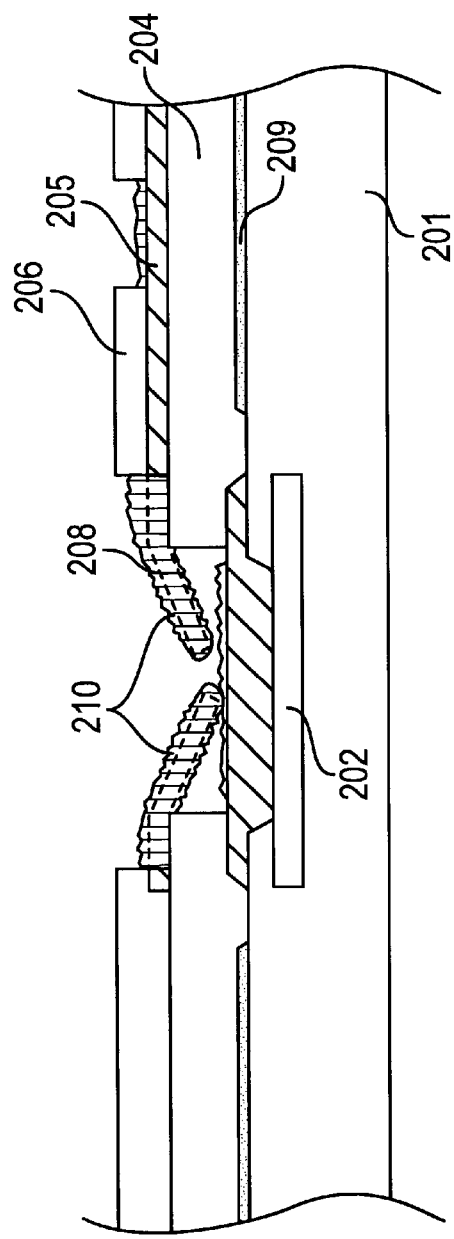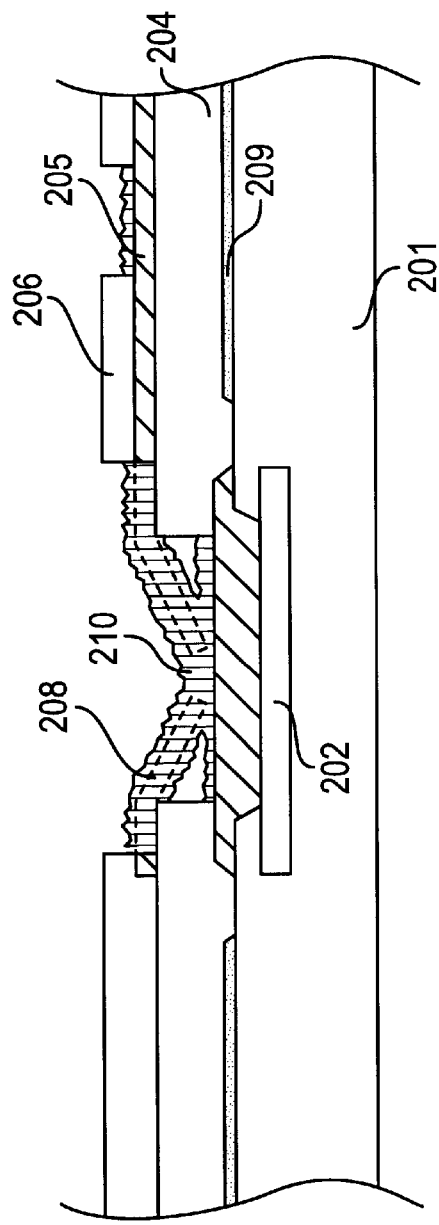
FIG. 2C
FIG. 2D

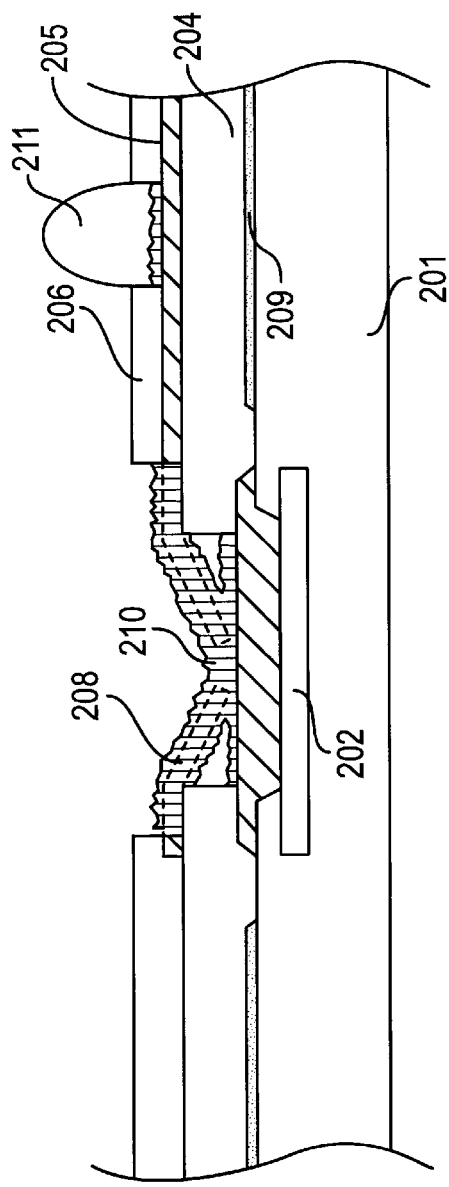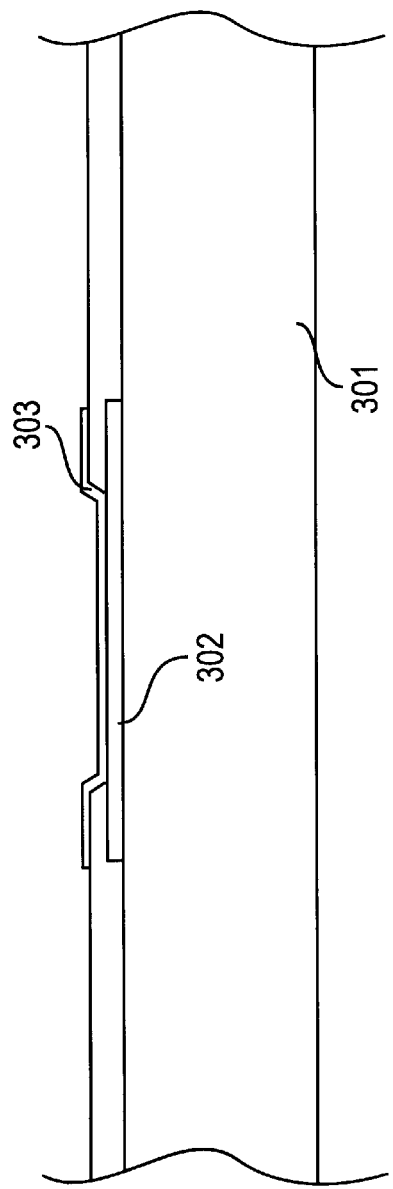

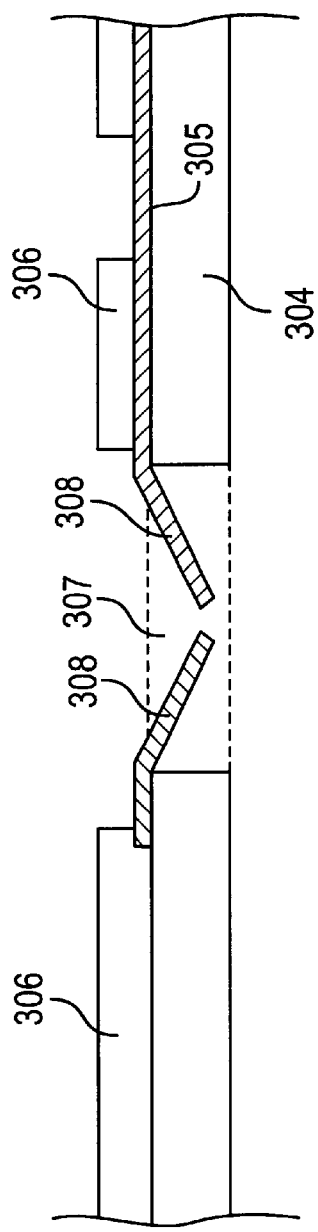
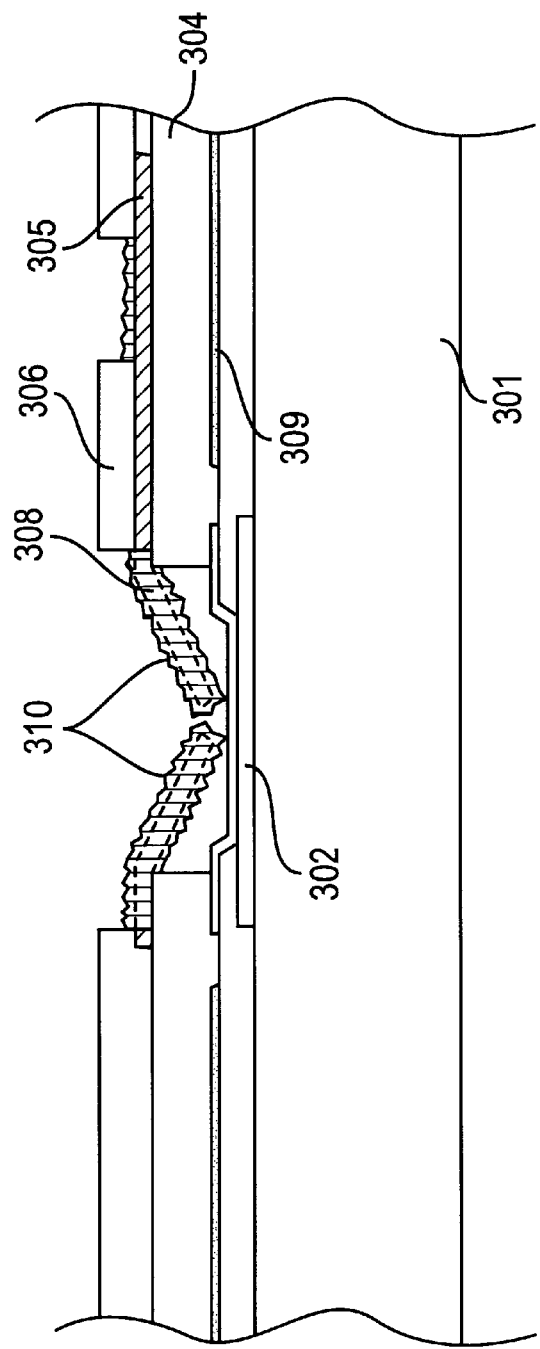

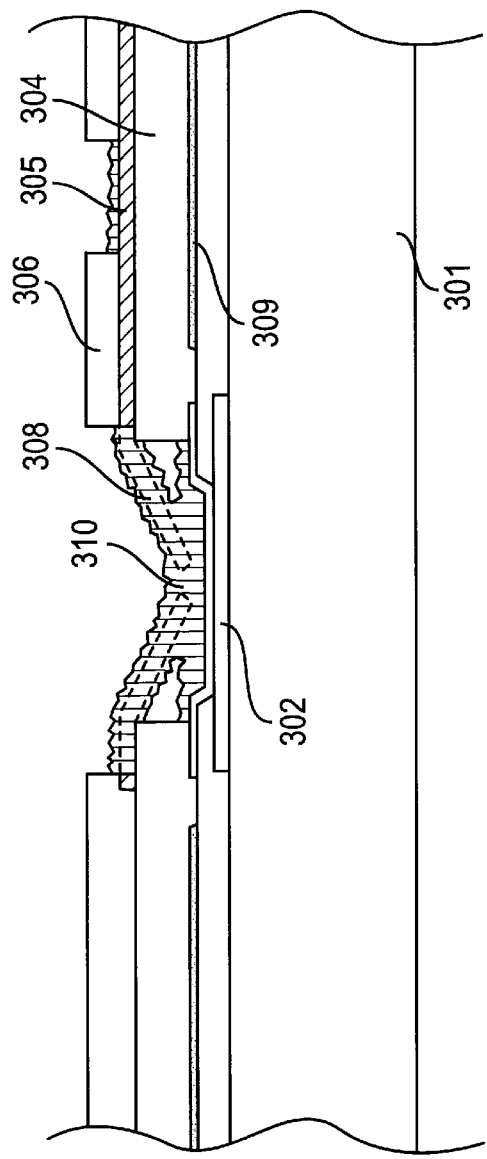
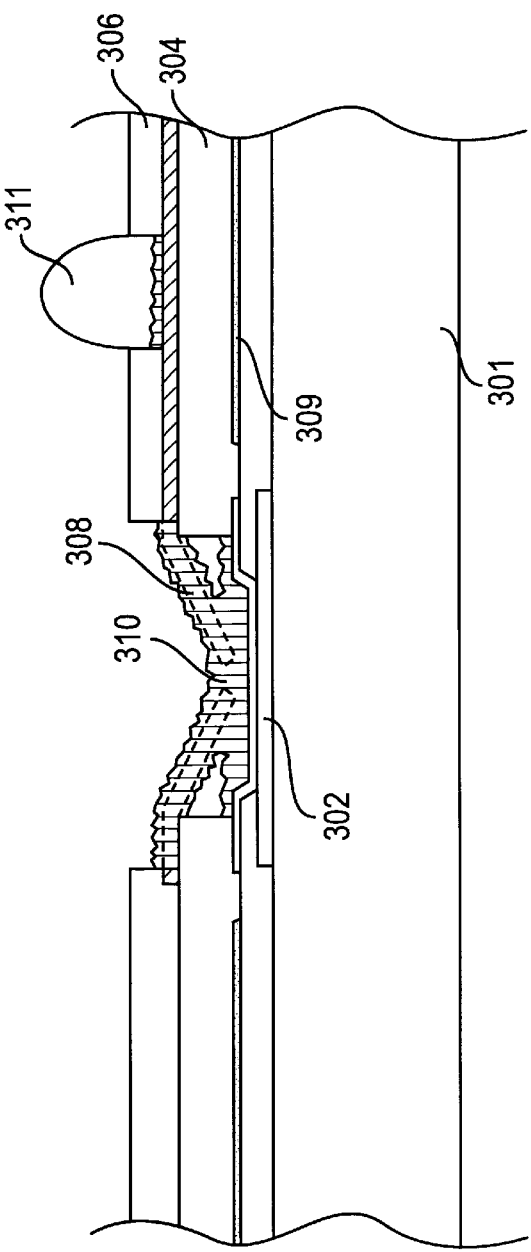
FIG. 3D
FIG. 3E

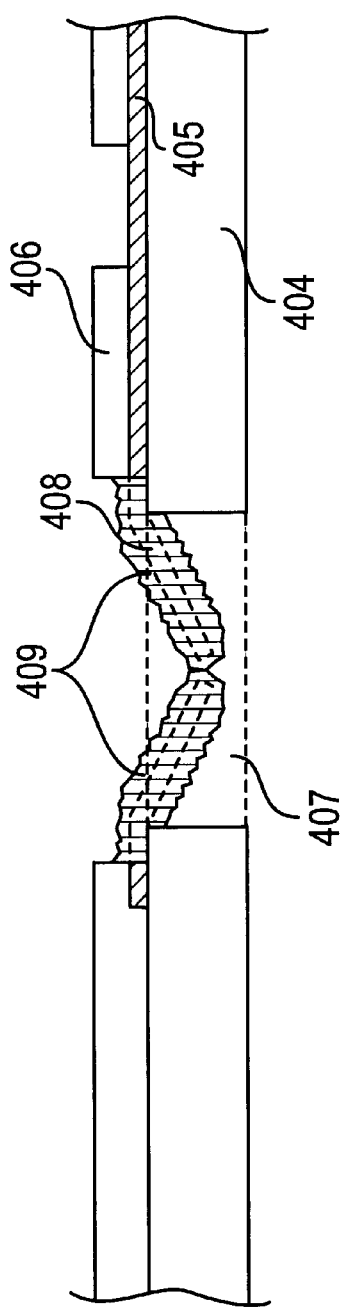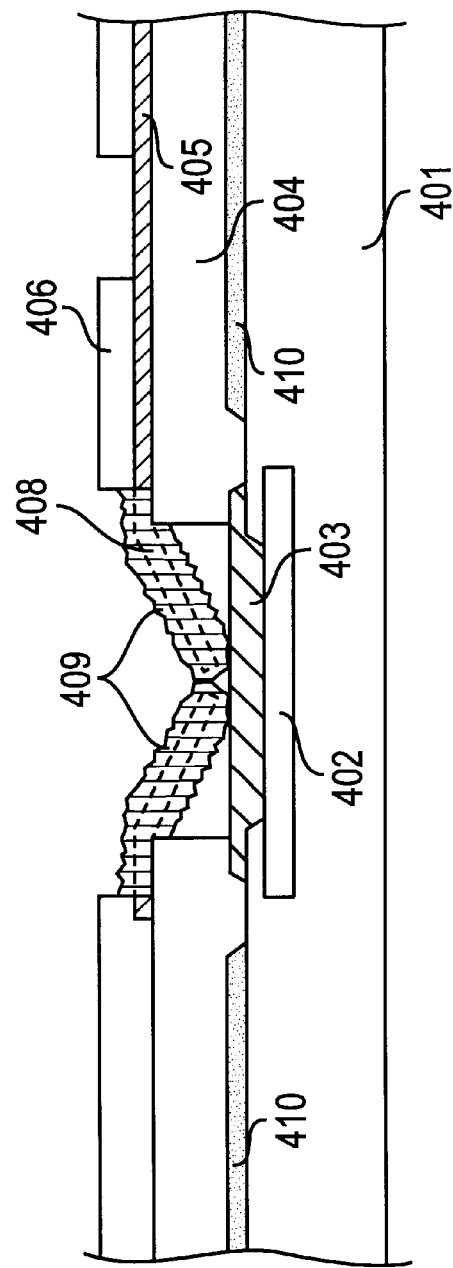

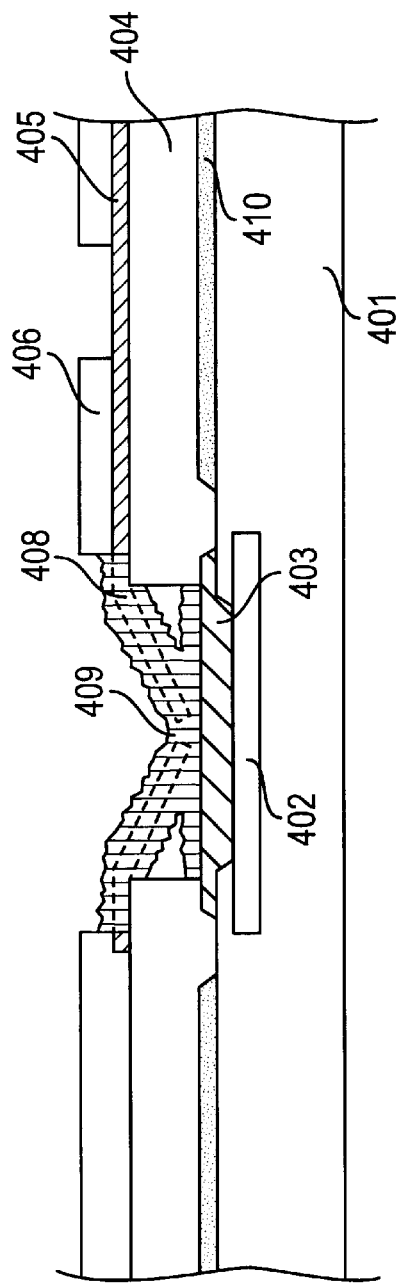
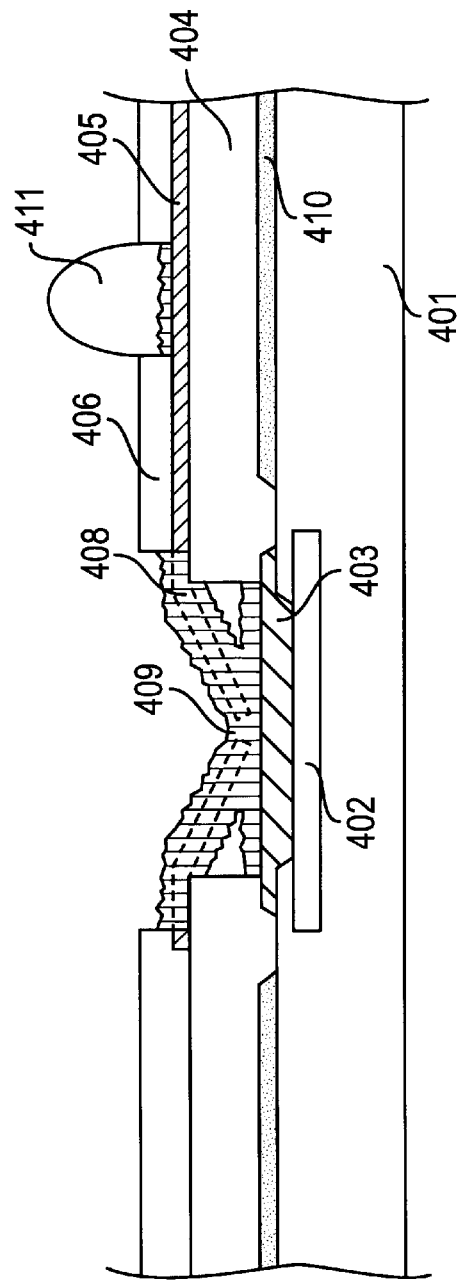
FIG. 4E
FIG. 4F

BUMPLESS FLIP CHIP ASSEMBLY WITH STRIPS-IN-VIA AND PLATING

The present application is an application filed in accordance with 35 U.S.C. §119 and claims the benefit of earlier filed Singapore application number 9804800-2 filed on Dec. 17, 1998.

1. Field of the Invention

This invention relates generally to a semiconductor device assembly, and in particular, to a chip assembly which includes a single or multi-layered substrate of which circuitry traces are connected to the input/output terminal pads of the IC chip through deposition of conductive material onto pre-formed leads in substrate via holes.

2. Background of the Invention

Recent developments in semiconductor packaging suggest an increasingly critical role of the technology. New demands are coming from requirements for more leads per chip (and hence smaller input/output terminal pad pitch), shrinking die and package footprints, and higher operational frequencies that generate more heat (thus requiring advanced heat dissipation designs). All of these considerations must be met and, as usual, are placed in addition to the cost that packaging adds to the overall semiconductor manufacturing process.

Conventionally, there are three predominant chip-level connection technologies in use for integrated circuits, namely wire bonding, tape automated bonding (TAB) and flip chip (FC), to electrically or mechanically connect integrated circuits to lead frame or substrate circuitry. Wire bonding has been by far the most broadly applied technique in the semiconductor industry because of its maturity and cost effectiveness. However, this process can be performed only one wire bond at a time between the semiconductor chip's bonding pads and the appropriate interconnect points. Furthermore, because of the ever-increasing operational frequency of the device, the length of the interconnects need to be shorter to minimize inductive noise in power and ground, and also to limit the crosstalk between the signal leads. An example of such a method is disclosed in U.S. Pat. No. 5,397,921 issued to Kanezos.

Flip chip technology is characterized by mounting of an unpackaged semiconductor chip with the active side facing down to an interconnect substrate through some kind of contact anchors such as solder, gold or organic conductive adhesive bumps. The major advantage of the flip chip technology is the short interconnects which can, therefore, handle high speed or high frequency signals. There are essentially no parasitic elements, such as inductance. Not only is the signal propagation delay slashed, but much of the waveform distortion is also eliminated. Flip chip also allows an array interconnecting layout that provides more I/O than a perimeter interconnect with the same die size. Furthermore, it requires minimal mounting area and weight, which results in overall cost savings since no extra packaging and less circuit board space is used. An example of such a method is disclosed in U.S. Pat. No. 5,261,593 issued to Casson et al.

While flip chip technology shows tremendous advantage over wire bonding, its cost and technical limitations are significant. First of all, prior art flip chip technology must confront the challenges of forming protruded contact anchors or bumps to serve as electrical connections between the integrated circuit chip and substrate circuitry. Examples of such an approach are disclosed in U.S. Pat. No. 5,803,340 issued to Yeh, al. et. al. and U.S. Pat No. 5,736,456 issued to Akram. These approaches typically include a very costly vacuum process to deposit an intermediate under-bump layer that serves as an adhesive and diffusion barrier. This barrier layer is typically composed of a film stack that can be in the structure of chromium/copper/gold. Bumping materials such as solder are subsequently deposited onto this intermediate layer through evaporation, sputtering, electroplating, solder jetting or paste printing methods followed by a re-flow step to form the solder contacts. Although evaporation and sputtering techniques can potentially offer high density bumps, these processes need very tight controls and normally result in poor yield. In addition, from the mechanical structural viewpoint, the coefficient of thermal expansion (CTE) of silicon and the substrate may be quite different, causing the stress between these two parts after attachment to build up and become fully loaded onto these bumps. This can then cause severe joint cracking and disconnection problems during normal operation conditions. As a result, a conventional flip chip assembly is not only very costly but also suffers from very serious reliability problems and a high fatality ratio.

Techniques for fabricating the intermediate under-bump barrier layer as well as the bump material utilizing electroless plating are also known in the prior art. An example of such a method is described in the U.S. Pat. No. 5,583,073 issued to Lin et al. Although this electroless technique provides an economical, simple and effective method for providing an under bump barrier layer, contacting material such as solder or adhesive is still required for assembling. Solder dipping or screen printing of solder paste onto these bumps has been explored but have been met with very limited success due to lack of solder bridging control and non-uniform deposition of solder on the metal bump. This process also suffers from poor process control as input/output terminal pad spacing gets smaller. Additional problems have been encountered with tin/lead solder systems due to its increase in electrical resistance over time, and these solder contacts are easily fatigued by thermo-mechanical stressing.

In view of the limitations of currently available integrated circuits assembling methods, a high performance, reliable and economical device and method that can effectively interconnect integrated circuits to the external circuitry would be greatly desirable.

SUMMARY OF THE INVENTION

It is therefore an object of the present invention to provide a flip chip assembly to address high density, low cost and high performance requirements of semiconductor packaging. The present invention involves the bonding of substrate circuitry to semiconductor device through connection of pre-formed leads inside the via holes or apertures to IC terminal pads beneath the via holes without the need for conventional bumps, bonding wire, or other media. This provides both electrical and mechanical connections between the IC chip and circuitry of the substrate.

In accordance with an aspect of the invention, a flip chip assembly includes a semiconductor chip including a terminal pad, a substrate including a dielectric layer and an electrically conductive trace, wherein the dielectric layer includes first and second surfaces that are opposite one another and a via hole that extends between the first and second surfaces, the conductive trace is disposed on the first surface and bent proximate to a corner between the first surface and the via hole at a different angle than the corner and extends into the via hole without extending to the second surface and without contacting the terminal pad, the via hole is aligned with the terminal pad, and the second surface is attached to the chip, and a plated metal in the via hole that is plated on and electrically connects the conductive trace and the terminal pad.

Preferably, the conductive trace laterally extends across a majority of a diameter of the via hole and vertically extends across a majority of a depth of the via hole and contacts substantially none of the dielectric layer at sidewalls of the via hole, the plated metal contacts the dielectric layer at sidewalls of the via hole, substantially all of the plated metal is withtin the via hole, and the conductive trace and the plated metal are the only materials in the via hole. Suitable plated metals include electroplated and electrolessly plated metals.

In accordance with another aspect of the invention, rather than the plated metal, a solder joint in the via hole contacts and electrically connects the conductive trace and the terminal pad. The solder joint also contacts some but not all of a portion of the sidewalls between the conductive trace and the terminal pad.

Using extended leads and conductive material directly deposited in the via hole can effectively connect the IC chip and substrate circuitry without external bumps or wires. This approach allows a reliable, low profile, high performance and low cost assembly to be achieved. In particular, a small via hole, formed by laser drilling or other techniques, allows a very fine pitch terminal pad to be interconnected, which can significantly enhance the capability of packaging future high I/O semiconductor chips.

BRIEF DESCRIPTION OF THE DRAWINGS

FIGS. 2A–2E are fragmented partial sectional side elevational views showing sequentially the manufacture of an integrated circuit assembly by electroless plating according to an embodiment of the present invention.

FIGS. 3A–3E are fragmented partial sectional side elevational views showing sequentially the manufacture of an integrated circuit assembly by electrolytic plating according to another embodiment of the present invention.

FIGS. 4A–4F are fragmented partial sectional side elevational views showing sequentially the manufacturing of an integrated circuit assembly by reflowing pre-deposited solder according to another embodiment of the present invention.

DETAILED DESCRIPTION OF THE INVENTION

Figure 1:
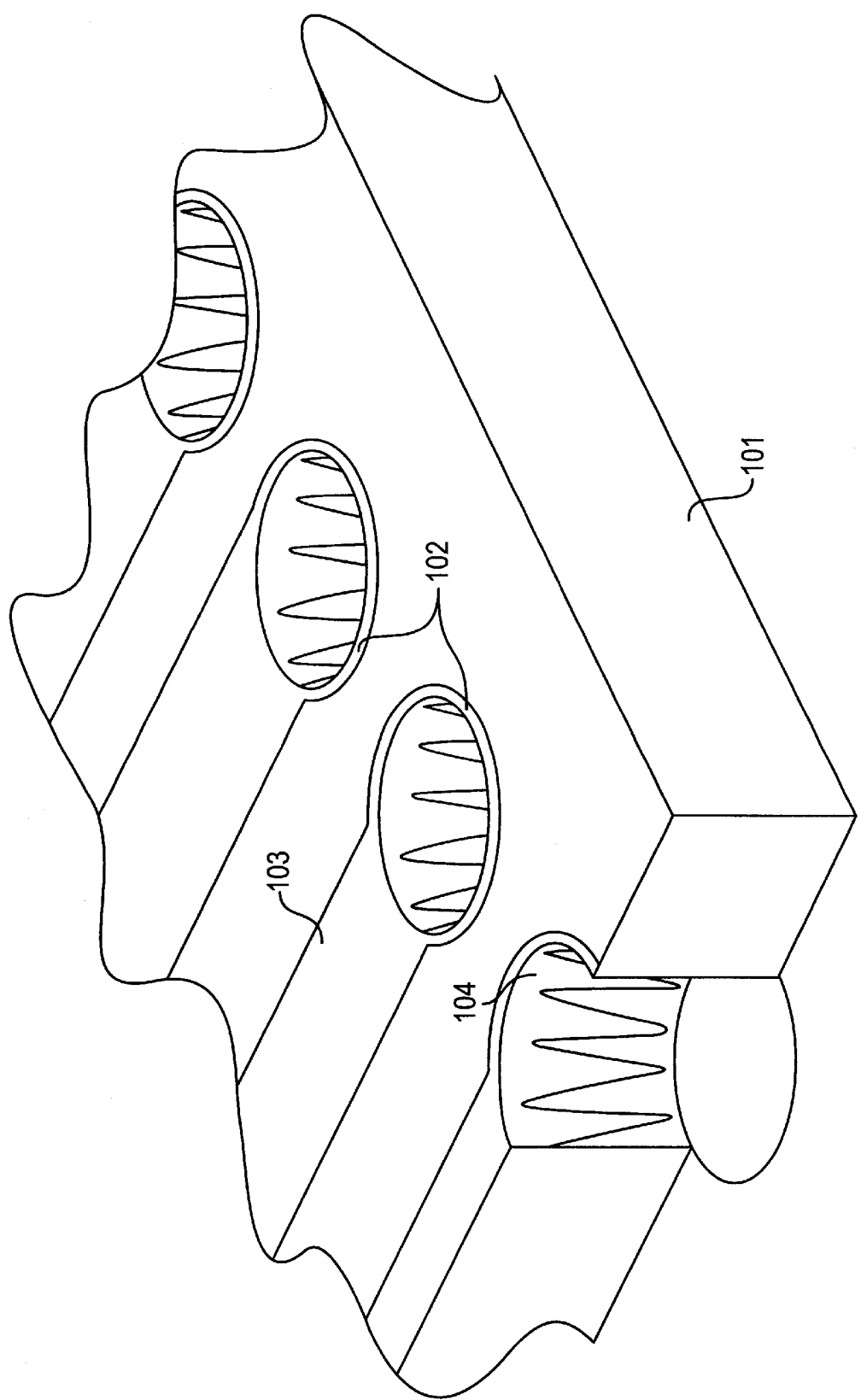
FIG. 1 is a fragmented perspective view of a substrate showing via holes and traces of the substrate circuitry according to an embodiment of the present invention.

The bumpless flip chip assembly of the present invention includes a rigid or flexible dielectric substrate having a plurality of electrically conductive circuitry traces and a plurality of via holes formed in the dielectric substrate. The conductive traces on the surface of the substrate extend into the via holes through leads that are fabricated by conventional circuitry patterning, cutting or punching methods. FIG. 1 is a perspective view of a section of such a substrate 101 in which via holes 102 are formed by laser or mechanical drilling. The via holes 102 serve as interconnecting channels between circuitry traces 103 and IC terminal pads (not shown) that is subsequently deposited beneath the via holes through the pre-formed leads 104 hanging inside the via holes and an electrically conductive material (not shown) that is subsequently deposited into the via holes. Circuitry traces 103 which extend from via holes 102 along an outer surface of the substrate 101, lead to another pad connection for next level assembly.

The orientation of the contact ensures that at least one of the via holes in the dielectric substrate is aligned with a pad of the IC chip so that the pad can be totally or partially exposed and/or accessed through the opposite side ofthe substrate. After alignment, the IC chip is attached to the dielectric substrate through adhesive film or paste, or mechanical techniques to form a chip assembly. Electrically conductive material is disposed between the leads and the input/output terminal pads of the IC chip to complete the connection of the IC chip and the substrate circuitry.

As defined herein, the preferred embodiment is particularly directed to the bonding of an integrated circuit (IC) chip to a flexible circuitized substrate, or to a more rigid, circuitized substrate, a particular example of the latter being a printed circuit board. It is to be understood, however, that the invention is not limited to attachment to printed circuit boards, in that other circuitized substrates, including known flexible substrate tapes, plastic substrates or ceramic substrates, may be employed. Typically, an organic-type substrate is preferable for lower cost and superior dielectric property whereas an inorganic type substrate is preferable when high thermal dissipation and matched coefficient of expansion are desired. The term "substrate" as used herein is defined as at least one layer of dielectric material having at least one conductive layer thereon. Printed circuit boards of similar type are well known in the electronics industry, as well as the processes for making the same and, therefore, further definition is not believed to be necessary. Such structures may include many more electrically conductive layers than those depicted in FIGS. 1 through 4F, depending on the desired operational characteristics. As is known, such electrically conductive layers may function as signal, power, and/or ground layers.

In one embodiment of the invention, the conductive material that connects the leads to the pads is deposited on the leads and the pads by electrolytic plating (electroplating). In this method, the assembly is connected to an external power source and serves as one of the electrodes for the electrolytic plating. Electrolytic plating of metals and alloys, is common and is well known in the industry, so further elaboration is not necessary. The metallic leads as well as other conductive parts of the assembly that are connected to the external power source and exposed to the plating solution generate a cathodic reaction to continuously deposit metal or alloys thereon. This deposition of metal or alloys results in a longer and wider lead as the electroplating reaction proceeds. In the initial stage, the terminal pads of the IC chip are also immersed in the plating solution but do not receive any deposition due to a lack of connection to the external power source. However, as the plating process continues, the leads which are bent toward the inside of the via holes, lengthen out as the plated metal grows and finally reach the surface ofthe terminal pads which are located at the bottom of the via holes. The plated leads then provide electrical power to the IC terminal pads which initiates electroplating thereon. This simultaneous electroplating of the leads and the terminal pads forms electroplated joints that provide effective electrical and mechanical connections between the IC chip and the dielectric circuitry. This not only assures a very desireable inter-metallic structure but also assures a pre-defined, very reliable connection between the substrate and IC chip due to the flexibility of the leads. In order to provide a good contact and prevent oxidation or dissolution of the IC terminal pads before the plating starts, the pads are commonly pre-treated or coated with a protective layer such as a stack of thin film before the substrate and IC chip are attached together.

In another embodiment of the invention, the conductive material that connects the leads to the pads is deposited on the leads and the pads by electroless (chemical) plating. In this method, the electroless plating can be initiated on the catalyzed leads and continuously deposit metal or alloys thereon. In contrast to the electrolytic plating, no external power is necessary to sustain the plating reaction and the metal deposition is achieved by a chemical reaction controlled by at least one reducing agent (catalyst) such as hypophosphite. Since electroless plating is a common practice and well known in the industry, no further explanation is necessary. Under certain pre-defined bath conditions (e.g., temperature and chemical composition), the catalyzed leads are immersed in the plating bath and readily initiate the plating bath to continuously deposit metal or alloys thereon. Similarly, this deposition of metal or alloys results in longer and wider leads as the electroless plating reaction proceeds. The terminal pads of the IC chip are also immersed in the plating solution and receive electroless deposition simultaneously with the leads.

For example, a catalyzed or oxide-free nickel which is pre-coated on an aluminum pad will enable the plating reaction to proceed on the pads as well. As the plating process continues, the leads which are bent toward the inside of the via holes lengthen out as the plated metal grows. Likewise, as the plating process continues, the plated metal grows on the terminal pads located at the bottom of the via holes. Eventually, the simultaneously plated-up parts of the leads and terminal pads contact one another and join together to form electrolessly plated joints the provide effective electrical and mechanical connections between the IC chip and dielectric circuitry. This not only assures a very flexible design in the substrate circuitry since no external contact to a power source is necessary, but also assures a very reliable metallic interface between the substrate and the chip.

According to another embodiment of the invention, the conductive material that connects the leads to the pads is solder that is deposited on the leads and then reflowed onto the pads. In this method, the leads inside the via holes are pre-coated with soldering and brought near to or in contact with the IC terminal pads. Heat, which serves to activate the flux and bring the solder to its melting point to effect the metallurgical bonding, is then applied to the assembly. This re-flow process results in solder joints which electrically and physically connect the pre-coated leads and IC pads. This not only assures a very low cost and simple process but also provides a compliant joint with significant stress release, which results in a very reliable connection between the substrate circuitry and IC chip.

Various techniques including electroplating, wave soldering, meniscus solder coating, solder paste printing and dispensing can pre-coat the soldering materials onto the leads. It is understood that the particular soldering material and methods of dispensing depicted above are not meant to limit the invention, in that it is also possible to directly place solder particles onto the leads and re-flow the solder particles prior to the IC mounting. In the case of solder paste application, flux is normally incorporated and the considerations are the same as described above for a conventional printed circuit board assembly. Since the soldering material on the leads may take the form of paste, or plated-up deposition, heat transfer techniques such as conduction, convection, radiation, or a combination of these is normally needed to re-flow the soldering material in order to wet the IC pad surface. A preferred application of such heat is achieved by using a laser. Alternatively, the attached assembly may be positioned within a suitable oven to effect solder re-flow and bonding to the IC terminal pads which are in the vicinity of the via holes. One example of such an approach is an infrared (IR) continuous belt re-flow oven. In the alternative, hot nitrogen gas may be directed onto the solder members of the assembly. It is understood that the particular re-flow techniques depicted above are not meant to limit the invention, in that it is also possible to re-flow the solder by vapor phase re-flow or other similar techniques.

A barrier layer over-coated on an aluminum pad is preferred as it provides good solder wetting and protects the aluminum surface against leaching, oxidation or degradation resulting from heat and soldering contact. This coating can be accomplished by sputtering a stake of thin film or by wet chemical direct plating such as electroless nickel and immersion gold. For a copper terminal pad, the pretreatment may not be necessary as long as its surface is free of oxide and contamination.

The contacting leads that are located inside of the via holes may take the form of strips with various shapes. Preferably, leads are fabricated conventional photolithographic patterning and etching. Alternately, the leads can be fabricated by micro-machining or laser cutting. After the leads are formed, they are bent toward the inside of the via holes in order to provide an effective connection path between the IC pads and the substrate circuitry. The bending of the leads can be achieved by a variety of methods such as vacuum suction, air blowing or mechanical pushing.

The via holes of the substrate can be formed by various techniques including mechanical drilling, punching, plasma etching or laser drilling. The via holes are formed at locations that can be aligned with and expose input/output terminal pads of the semiconductor chip or chips that are subsequently mounted on the side of the substrate opposite the side where the electrical circuitry is formed.

If the finished product is, for instance, a ball grid array package, solder balls will normally be placed on the specific trace on the surface of the dielectric substrate. This finished package can be connected to a printed circuit board by re-flowing the solder balls to form an attachment to the conductor of the printed circuit board.

The present invention will be illustrated further by the following examples. These examples are meant to illustrate and not to limit the invention, the scope of which is defined solely by the appended claims.

EXAMPLE 1

FIG. 2A shows an integrated circuit chip 201 with various types of transistors, wiring and the like (not shown) having a plurality of exposed input/output terminal pads 202 (only one shown). Pads 202 a firstly cleaned by dipping the integrated circuitry chip 201 in a phosphoric acid solution at room temperature with an immersion time of 10 minutes to remove the surface oxide film. The chip is next dipped in a diluted catalytic solution Enthone "Alumon EN" (trademark) at 25 degrees Celsius for 20 seconds to form a thin zinc film (not shown) on the surface of aluminum alloy terminals 202. Subsequent steps include a thorough distillated water rinse and electroless plating using Shipley "NIPOSIT 468" (trademark) at 85 degrees Celsius. The electroless plating continuously deposits a thin layer of nickel film 203 containing phosphorous (to be referred to as a nickel film hereafter) on the input/output terminal pads 202 of the integrated circuit chips 201.

FIG. 2B shows a substrate 204 having a plurality of electrically conductive circuitry traces 205 partially covered by the solder mask 206. The traces 205 on the substrate 204 extend to the via holes 207 and split into a plurality of leads 208 which are bent toward the inside of the via hole. Via holes 207 are arranged in such a manner that the terminal pads 202 of the integrated circuit chip 201 can be totally or partially exposed when integrated circuit chip 201 is subsequently mounted on the substrate 204. The bent leads 208 serve as the electrically connecting channels for the respective traces 205 of the substrate 204 with respective terminal pads 202 of the integrated circuit chips 201. These leads are activated by immersing them in a palladium chloride solution (0.05 M) for electroless (chemical) plating before attachment.

As shown in FIG. 2C, the IC chip 201 is securely attached to the substrate 204 by adhesive paste ABLESTIK "ABLEBOND 961-2" 209 and this assembly is immersed in the electroless plating solution Shipley "NIPOSIT 468" at 65 degrees Celsius. The electroless plating initiates and continuously deposits nickel 210 on the leads 208 as well as on the pre-deposited nickel film 203 on the input/output terminal pads 202 ofthe integrated circuit chips 201.

As FIG. 2D shows, the plated bent leads 208 and plated input/output terminal pads 202 finally contact and join together to become an integrated part. These simultaneously-plated joints 210 provide effective electrical and mechanical connections between the input/output terminals pads 202 and the traces 205.

As shown in FIG. 2E, the solder ball 211 is attached to the trace 205 at the opening site of the solder mask 206 to provide the finished assembly for the next level connection.

Though only one integrated circuit chip 201 is shown it is to be understood that additional integrated circuit chips, as well as passive components such as resistors or capacitors, can also be mounted on the substrate 204.

EXAMPLE 2

Referring now to FIG. 3A, an integrated circuit chip 301 similar to that in example 1 was cleaned in an alkaline solution containing 0.05M phosphoric acid at room temperature (25 degrees Celsius) with an immersion time of 1 minute. The chip is then thoroughly rinsed in distillated water to ensure there is no residue on its surface. A stake of thin film 303 in the structure of chromium (500 Angstroms)/copper (700 Angstroms)/gold (1000 Angstroms) is deposited and patterned on the terminal pads 302 to serve as the barrier and adhesive layer.

FIG. 3B shows a dielectric substrate 304 having a plurality of electrically conductive circuitry traces 305 partially covered by the solder mask 306. The traces 305 on the substrate 304 extend into via holes 307 and split into a plurality of leads 308 which are bent toward the inside of the via holes 307. Via holes 307 are arranged in such a manner that the terminal pads 302 of the integrated circuit chip 301 can be totally or partially exposed when integrated circuit chip 301 is subsequently mounted on the substrate 304. The bent leads 308 serve as the electrically connecting channels for the respective traces 305 of the substrate 304 with respective terminal pads 302 of the integrated circuit chips 301.

As shown in FIG. 3C, the IC chip 301 is securely attached to the substrate 304 by adhesive film ABLESTIK "ABLEFILM 561K" 309 and the assembly is immersed in the copper plating solution Sel-Rex "CUBATH M" at 25 degrees Celsius. An electrical power source is connected to traces 305. As a result, an electroplating reaction initiates and continuously deposits copper 310 on the bent leads 307. As the plating process proceeds, the length and width of the leads 307 continuously increases due to the growth of copper 310 thereon.

FIG. 3D shows that the plated copper 310 on leads 307 has reached the gold surface of thin film 303 of the terminal pads 302 to provide electrical contact with the terminal pads 302 and to initiate copper plating on the terminal pads 302. These electroplated joints 310 provide effective electrical and mechanical connections between the input/output terminal pads 302 and traces 305 and therefore the top surface of the dielectric circuitry.

As shown in FIG. 3E, the solder ball 311 is attached to the trace 305 at the opening site of the solder mask 306 to provide the finished assembly for the next level connection.

EXAMPLE 3

Figure 4A:
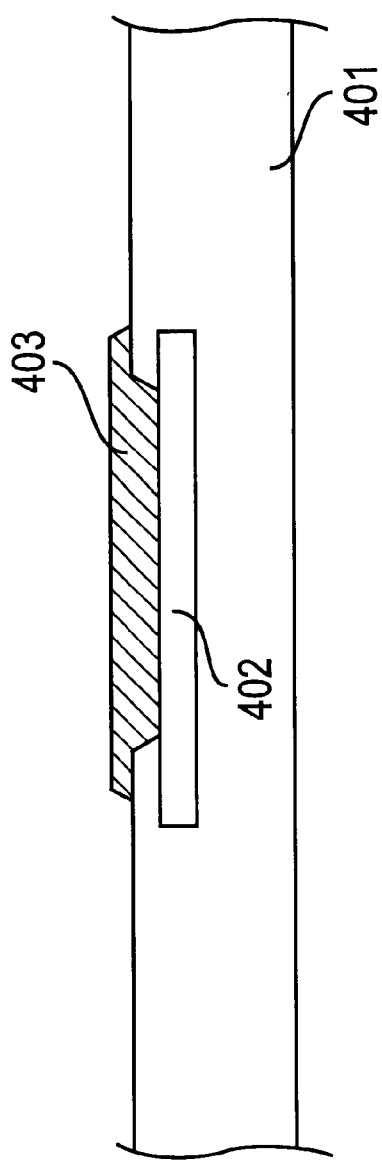

FIG. 4A shows an integrated circuit chip 401 with various types of transistors, wiring and the like (not shown) having a plurality of exposed input/output terminal pads 402 (only one shown). Pads 402 a firstly cleaned by dipping the integrated circuitry chip 401 in a phosphoric acid solution at room temperature with an immersion time of 10 minutes to remove the surface oxide film. The chip is next dipped in a diluted catalytic solution Enthone "Alumon EN" at 25 degrees Celsius for 20 seconds to form a thin zinc film (not shown) on the surface of aluminum alloy terminal pads 402. Subsequent steps include a thorough distillated water rinse and electroless plating using Shipley "NIPOSIT 468" at 65 degrees Celsius. The electroless plating continuously deposits a thin layer of nickel film 403 containing phosphorous (to be referred to as a nickel film hereafter) on the input/output terminal pads 402 of the integrated circuits chips 401.

Figure 4B:
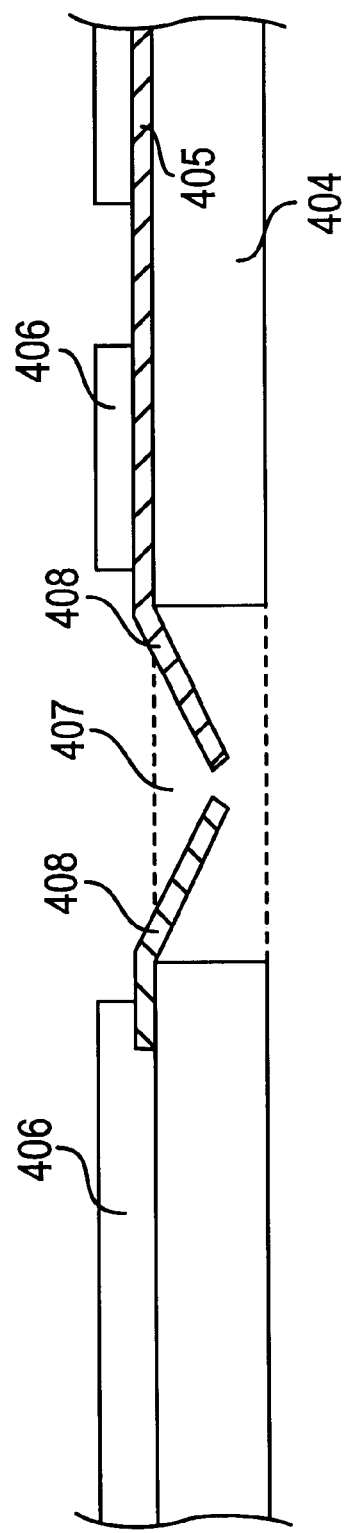

FIG. 4B shows a dielectric substrate 404 having a plurality of electrically conductive circuitry traces 405 partially covered by the solder mask 406. The traces 405 on the substrate 404 extend to via holes 407 and split into a plurality of leads 408 which are bent towards the inside of the via hole. Via holes 407 are arranged in such a manner that the terminal pads 402 of the integrated circuit chip 401 can be totally or partially exposed when integrated circuit chip 401 is subsequently mounted on the substrate 404. The bent leads 408 are to serve as electrically connecting channels for respective traces 405 of the substrate 404 with respective terminal pads 402 of the integrated circuit chips 401.

As shown in FIG. 4C, the substrate 404 is brought in contact with a molten solder bath (Sn-Pb) from the surface opposite solder mask 406 where there is no circuitry thereon. Solder 409 is readily deposited onto the leads 407 the moment they contact the molten solder bath.

As shown in FIG. 4D, the IC chip 401 is next securely attached to the substrate 404 by adhesive paste ABLESTIK "ABLEBOND 961-2" 410.

FIG. 4E shows the solder 409 the IC terminal pads 402 after the assembly is placed in a conventional re-flow oven that causes solder 409 to reflow onto and cover pads 402, thereby forming integrated solder joints that contact and electrically connect leads 408 to pads 402. As is seen, the solder joints contact top and bottom portions of the sidewalls of via holes 407 between leads 408 and pads 402 without contacting central portions of the sidewalls between the top and bottom portions of the sidewalls.

FIG. 4F shows the solder ball 411 is attached to the trace 405 at the opening site of the solder mask 406 to provide the finished assembly for the next level connection.

It is to be understood that many solder systems including lead-free ones can be applied and serve the connection purpose.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims and all changes which come within the meaning and range of equivalency of the claims are, therefore, to be embraced therein.

What is claimed is:

1. A flip chip assembly, comprising:
    a dielectric substrate having first and second surfaces that are opposite one another and a plurality of via holes between the first and second surfaces;
    a plurality of conductive traces on the first surface and adjacent to the via holes, wherein each of the conductive traces includes a lead that is bent to extend into one of the via holes;
    an integrated circuit chip having a plurality of input/output terminal pads, wherein the integrated circuit chip is attached to the second surface of the dielectric substrate, the terminal pads are aligned with the via holes, and the leads do not contact the pads; and
    a plated metal in the via holes that is plated on and electrically connects the leads and the terminal pads.

2. The flip chip assembly according to claim 1, wherein a dielectric portion of the dielectric substrate is plastic.

3. The flip chip assembly according to claim 1, wherein a dielectric portion of the dielectric substrate is a flexible film.

4. The flip chip assembly according to claim 1, wherein a dielectric portion of the dielectric substrate is ceramic.

5. The flip chip assembly according to claim 1, wherein the via holes are formed in the dielectric substrate by a method selected from the group consisting of laser drilling, mechanical punching, plasma etching and chemical etching.

6. The flip chip assembly according to claim 1, wherein the leads are fabricated using photolithographic patterning and etching.

7. The flip chip assembly according to claim 1, wherein the leads are fabricated using laser cutting.

8. The flip chip assembly according to claim 1, wherein the terminal pads include a stack of metal film deposited by sputtering.

9. The flip chip assembly according to claim 1, wherein the terminal pads include a stack of metal film deposited by evaporation.

10. The flip chip assembly according to claim 1, wherein the terminal pads include a stack of metal film deposited by electroless plating.

11. The flip chip assembly according to claim 1, wherein the integrated circuit chip is attached to the second surface of the dielectric substrate by an adhesive film.

12. The flip chip assembly according to claim 1, wherein the integrated circuit chip is attached to the second surface of the dielectric substrate by an adhesive paste.

13. The flip chip assembly according to claim 1, wherein the integrated circuit chip is attached to the second surface of the dielectric substrate by a clamp.

14. The flip chip assembly according to claim 1, wherein the plated metal is plated on the leads and the pads by electrolytic plating.

15. The flip chip assembly according to claim 1, wherein the plated metal is plated on the leads and the pads by chemical plating.

16. A flip chip assembly, comprising:
    a dielectric substrate having first and second surfaces that are opposite one another and a plurality of via holes between the first and second surfaces;
    a plurality of conductive traces on the first surface and adjacent to the via holes, wherein each of the conductive traces includes a lead that is bent to extend into one of the via holes;
    an integrated circuit chip having a plurality of input/output terminal pads, wherein the integrated circuit chip is attached to the second surface of the dielectric substrate, the terminal pads are aligned with the via holes, and the leads do not contact the pads; and
    solder joints in the via holes that contact and electrically connect the leads and the terminal pads.

17. The flip chip assembly according to claim 16, wherein a soldering material that is reflowed to form the solder joints is deposited on the leads by electroplating.

18. The flip chip assembly according to claim 16, wherein a soldering material that is reflowed to form the solder joints is deposited on the leads by chemical plating.

19. The flip chip assembly according to claim 16, wherein a soldering material that is reflowed to form the solder joints is deposited on the leads by wave soldering.

20. The flip chip assembly according to claim 16, wherein a soldering material that is reflowed to form the solder joints is deposited on the leads by solder paste printing.

21. The flip chip assembly according to claim 16, wherein a soldering material that is reflowed to form the solder joints is deposited on the leads by meniscus coating.

22. A flip chip assembly, comprising:
    a semiconductor chip including a terminal pad;
    a substrate including a dielectric layer and an electrically conductive trace, wherein the dielectric layer includes first and second surfaces that are opposite one another and a via hole that extends between the first and second surfaces, the conductive trace is disposed on the first surface and bent proximate to a corner between the first surface and the via hole at a different angle than the corner and extends into the via hole without extending to the second surface and without contacting the terminal pad, the via hole is aligned with the terminal pad, and the second surface is attached to the chip; and
    a plated metal in the via hole that is plated on and electrically connects the conductive trace and the terminal pad.

23. The flip chip assembly as recited in claim 22, wherein the conductive trace contacts substantially none of the dielectric layer at sidewalls of the via hole.

24. The flip chip assembly as recited in claim 22, wherein the plated metal contacts the dielectric layer at sidewalls of the via hole.

25. The flip chip assembly as recited in claim 22, wherein the conductive trace laterally extends across a majority of a diameter of the via hole and vertically extends across a majority of a depth of the via hole.

26. The flip chip assembly as recited in claim 22, wherein the terminal pad is directly beneath substantially all surface area defined by the via hole.

27. The flip chip assembly as recited in claim 22, wherein substantially all of the plated metal is within the via hole.

28. The flip chip assembly as recited in claim 22, wherein the conductive trace and the plated metal are the only materials in the via hole.

29. The flip chip assembly as recited in claim 22, wherein a portion of sidewalls of the via hole between and spaced from the conductive trace and the terminal pad does not contact any material.

30. The flip chip assembly as recited in claim 22, wherein the plated metal is an electroplated metal.

31. The flip chip assembly as recited in claim 22, wherein the plated metal is an electrolessly plated metal.

32. A flip chip assembly, comprising:
a semiconductor chip including a terminal pad;
a substrate including a dielectric layer and an electrically conductive trace, wherein the dielectric layer includes first and second surfaces that are opposite one another and a via hole with sidewalls that extends between the first and second surfaces, the conductive trace is disposed on the first surface and bent proximate to a corner between the first surface and the via hole and extends into the via hole without extending to the second surface and without contacting the terminal pad and without contacting a majority of the sidewalls, the via hole is aligned with the terminal pad, and the second surface is attached to the chip; and
a plated metal in the via hole that is plated on the conductive trace and the terminal pad electrically connects the conductive trace to the terminal pad.

33. The flip chip assembly as recited in claim 32, wherein the corner forms a first angle, the conductive trace is bent proximate to the corner at a second angle, and the first angle is at least 50 percent larger than the second angle.

34. The flip chip assembly as recited in claim 32, wherein the first angle is about 90 degrees and the second angle is less than about 60 degrees.

35. The flip chip assembly as recited in claim 32, wherein the conductive trace laterally extends across a majority of a diameter of the via hole and vertically extends across a majority of a depth of the via hole.

36. The flip chip assembly as recited in claim 32, wherein the terminal pad is directly beneath all surface area defined by the via hole.

37. The flip chip assembly as recited in claim 32, wherein substantially all of the plated metal is within the via hole and the plated metal fills a bottom portion of the via hole.

38. The flip chip assembly as recited in claim 32, wherein the conductive trace and the plated metal are the only materials in the via hole.

39. The flip chip assembly as recited in claim 32, wherein a portion of the sidewalls between and spaced from the conductive trace and the terminal pad does not contact any material.

40. The flip chip assembly as recited in claim 32, wherein the plated metal is an electroplated metal.

41. The flip chip assembly as recited in claim 32, wherein the plated metal is an electrolessly plated metal.

42. A flip chip assembly, comprising:
a semiconductor chip including a terminal pad;
a substrate including a dielectric layer and an electrically conductive trace, wherein the dielectric layer includes first and second surfaces that are opposite one another and a via hole with sidewalls that extends between the first and second surfaces, the top surface and the sidewalls form a corner at a first angle, the conductive trace is disposed on the first surface and bent proximate to the corner at a second angle and extends into the via hole without extending to the second surface without contacting the terminal pad and without contacting a majority of the sidewalls, the conductive trace laterally extends across a majority of a diameter of the via hole and vertically extends across a majority of a depth of the via hole, the first angle is substantially larger than the second angle, the via hole is aligned with the terminal pad, and the terminal pad does not extend into the via hole;
an adhesive between and in contact with the second surface and the chip; and
a plated metal in the via hole that is plated on the conductive trace and the terminal pad and contacts the sidewalls and electrically connects the conductive trace to the terminal pad, wherein the conductive trace and the plated metal are the only electrical conductors in the via hole.

43. The flip chip assembly as recited in claim 42, wherein the first angle is about 90 degrees and is at least 50 percent larger than the second angle.

44. The flip chip assembly as recited in claim 42, wherein a portion of the conductive trace within the via hole includes at least three uniformly shaped tips that each point towards an axial center of the via hole.

45. The flip chip assembly as recited in claim 42, wherein the terminal pad is directly beneath all surface area defined by the via hole.

46. The flip chip assembly as recited in claim 42, wherein substantially all of the plated metal is within the via hole and the plated metal fills a bottom portion of the via hole.

47. The flip chip assembly as recited in claim 42, wherein a portion of the sidewalls between and spaced from the conductive trace and the terminal pad does not contact any material.

48. A flip chip comprising:
a semiconductor chip including a terminal pad;
a substrate including a dielectric layer and an electrically conductive trace, wherein the dielectric layer includes first and second surfaces that are opposite one another and a via hole with sidewalls that extends between the first and second surfaces, the conductive trace is disposed on the first surface and bent proximate to a corner between the first surface and the sidewalls at a different angle than the corner and extends into the via hole without extending to the second surface and without contacting the terminal pad, the via hole is aligned with the terminal pad, and the second surface is attached to the chip; and
a solder joint in the via hole that contacts and electrically connects the conductive trace and the terminal pad and contacts some but not all of a portion of the sidewalls between the conductive trace and the terminal pad.

49. The flip chip assembly as recited in claim 48, wherein the corner forms a first angle, the conductive trace is bent proximate to the corner at a second angle, and the first angle is at least 50 percent larger than the second angle.

50. The flip chip assembly as recited in claim 48, wherein the conductive trace contacts substantially none of the sidewalls.

51. The flip chip assembly as recited in claim 48, wherein the conductive trace laterally extends across a majority of a diameter of the via hole and vertically extends across a majority of a depth of the via hole.

52. The flip chip assembly as recited in claim 48, wherein the terminal pad is directly beneath all surface area defined by the via hole.

53. The flip chip assembly as recited in claim 48, wherein substantially all of the solder joints is within the via hole.

54. The flip chip assembly as recited in claim 48, wherein the solder joints fills a bottom portion of the via hole.

55. The flip chip assembly as recited in claim 48, wherein the conductive trace and the solder joint are the only materials in the via hole.

56. The flip chip assembly as recited in claim 48, wherein a portion of the conductive trace within the via hole includes at least three uniformly shaped tips that each point towards an axial center of the via hole.

* * * * *

UNITED STATES PATENT AND TRADEMARK OFFICE
CERTIFICATE OF CORRECTION

PATENT NO.      : 6,437,452 B2
DATED           : August 20, 2002
INVENTOR(S)     : Charles W.C. Lin It is certified that error appears in the above-identified patent and that said Letters Patent is hereby corrected as shown below:

<u>Title page,</u>
Item [30], insert the following:

-- [30]   Foreign Application Priority Data
   Dec. 17, 1998  (SG) .................. 9804800-2 --

Signed and Sealed this

Twenty-sixth Day of November, 2002

*Attest:*

*Attesting Officer*

JAMES E. ROGAN
*Director of the United States Patent and Trademark Office*